US008736790B2

(12) United States Patent
Lee

(10) Patent No.: US 8,736,790 B2
(45) Date of Patent: May 27, 2014

(54) ORGANIC LIGHT EMITTING DIODE DISPLAY WITH LIQUID CRYSTAL LAYER

(75) Inventor: Kyung-Jun Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/192,512

(22) Filed: Jul. 28, 2011

(65) Prior Publication Data

US 2012/0099047 A1    Apr. 26, 2012

(30) Foreign Application Priority Data

Oct. 22, 2010  (KR) .................. 10-2010-0103492

(51) Int. Cl.
    *G02F 1/1335*    (2006.01)
    *G02F 1/1343*    (2006.01)

(52) U.S. Cl.
    USPC ........................................ 349/69; 349/144

(58) Field of Classification Search
    USPC ............... 349/144, 69, 153; 313/503, 504
    See application file for complete search history.

(56) References Cited

U.S. PATENT DOCUMENTS

| | | | |
|---|---|---|---|
| 6,768,532 B1 * | 7/2004 | Sekiguchi | 349/153 |
| 7,038,641 B2 * | 5/2006 | Hirota et al. | 345/83 |
| 2009/0033596 A1 * | 2/2009 | Yoon et al. | 345/76 |
| 2009/0322997 A1 * | 12/2009 | Kaihoko et al. | 349/117 |

FOREIGN PATENT DOCUMENTS

| | | |
|---|---|---|
| KR | 10-2002-0022000 A | 3/2002 |
| KR | 10-2005-0119894 A | 12/2005 |
| KR | 10-2008-0001946 A | 1/2008 |
| KR | 10-0869810 B1 | 11/2008 |

* cited by examiner

*Primary Examiner* — Michael Caley
*Assistant Examiner* — Kendrick Hsu
(74) *Attorney, Agent, or Firm* — Lee & Morse, P.C.

(57) ABSTRACT

An OLED display according to an exemplary embodiment includes: a first substrate; a second substrate facing the first substrate; an organic light emitting element on the first substrate; a liquid crystal driving electrode facing the organic light emitting diode at a lower portion of the second substrate; and a plurality of liquid crystals between the organic light emitting element and the liquid crystal driving electrode. In this case, the plurality of liquid crystals has optical isotropy when an electric field is not applied and has optical anisotropy when the electric field is applied.

11 Claims, 6 Drawing Sheets

ORGANIC LIGHT EMITTING DIODE DISPLAY WITH LIQUID CRYSTAL LAYER

BACKGROUND

1. Field

Embodiments relate to an organic light emitting diode (OLED) display.

More particularly, embodiments relate to an OLED display that can control a viewing angle.

2. Description of the Related Art

An organic light emitting diode (OLED) display is a flat display device that has a self emissive characteristic and does not require a separate light source. The OLED display has characteristics of low power consumption, high luminance, and high response speed. The OLED display can be made lightweight and thin so that it can be used in portable electronic devices. Portable electronic devices may include a portable phone, a personal digital assistant (PDA), and a portable multimedia player (PMP).

The above disclosed information in the Background is only for enhancing an understanding of the described technology. Therefore, the Background may contain information that does not form the prior art that is already known to a person of ordinary skill in the art in this country.

SUMMARY

Embodiments are directed to an organic light emitting diode (OLED) display.

An OLED display, according to an exemplary embodiment, includes: a first substrate; a second substrate facing the first substrate; an organic light emitting element on the first substrate; a liquid crystal driving electrode facing the organic light emitting diode at a lower portion of the second substrate; and a plurality of liquid crystals between the organic light emitting element and the liquid crystal driving electrode. The plurality of liquid crystal may have optical isotropy when an electric field is not applied thereto and may have optical anisotropy when the electric field is applied thereto.

Liquid crystals may be blue-phase liquid crystals.

A pixel electrode, an organic emission layer, and a common electrode may be sequentially stacked in the organic light emitting element, and the plurality of liquid crystals may be driven by the common electrode and the liquid crystal driving electrode.

The liquid crystal driving electrode may cover the entire area of the second substrate.

The liquid crystal driving electrode may include a first liquid crystal driving electrode corresponding to the organic emission layer and a second liquid crystal driving electrode separated from the first liquid crystal driving electrode.

The OLED display according to the exemplary embodiment may further include a phase compensation plate formed at an opposite side of the liquid crystal driving electrode on the second substrate and a polarizing plate on the phase compensation plate.

The liquid crystal driving electrode may be transparent, and in this case, the liquid crystal driving electrode may include indium tin oxide (ITO) or indium zinc oxide (IZO).

The common electrode may be transparent, and in this case, the liquid crystal driving electrode may include ITO or IZO.

The OLED display according to the exemplary embodiment may further include a reflective layer on the pixel electrode.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
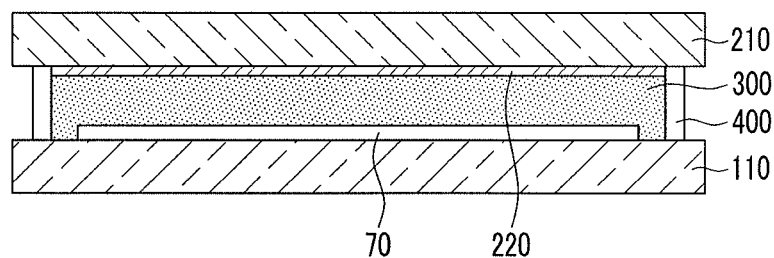
FIG. 1 is a cross-sectional view of an organic light emitting diode (OLED) display according to a first exemplary embodiment.

Korean Patent Application No. 10-2010-0103492, filed on Oct. 22, 2010, in the Korean Intellectual Property Office, and entitled: "Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be through and complete, and will fully convey the scope of the inventive concept to those skilled in the art.

The drawings and description are to be regarded as illustrative in nature and not restrictive. Like reference numerals designate like elements throughout the specification. The size and thickness of each component shown in the drawings are arbitrarily shown for understanding and ease of description, but the present invention is not limited thereto.

It will be understood that when an element such as a layer, film, region, or substrate is referred to as being "on" another element, it can be directly on the other element or intervening elements may also be present.

FIG. 1 is a schematic cross-sectional view of an organic light emitting diode (OLED) display 101 according to a first exemplary embodiment.

Referring to FIG. 1, the OLED display 101, according to the present exemplary embodiment, includes a display substrate 110 and an encapsulation substrate 210. The encapsulation substrate 210 faces the display plate 110, and the display substrate 110 and the encapsulation substrate 210 are sealed by a sealing member 400. An organic light emitting element 70 and an electron element, e.g., a thin film transistor for driving the same display substrate 110, are formed on the display substrate 110. Liquid crystals 300 are filled between the display substrate 110 and the encapsulation substrate 210. A liquid crystal driving electrode 220 is formed on the encapsulation substrate 210. The encapsulation substrate 210 faces the organic light emitting element 70 for driving the liquid crystals 300.

In the present exemplary embodiment, the liquid crystals 300 are driven by a common electrode of the organic light emitting element 70 and the liquid crystal driving electrode 220. Therefore, a viewing angle can be controlled.

Figure 2:
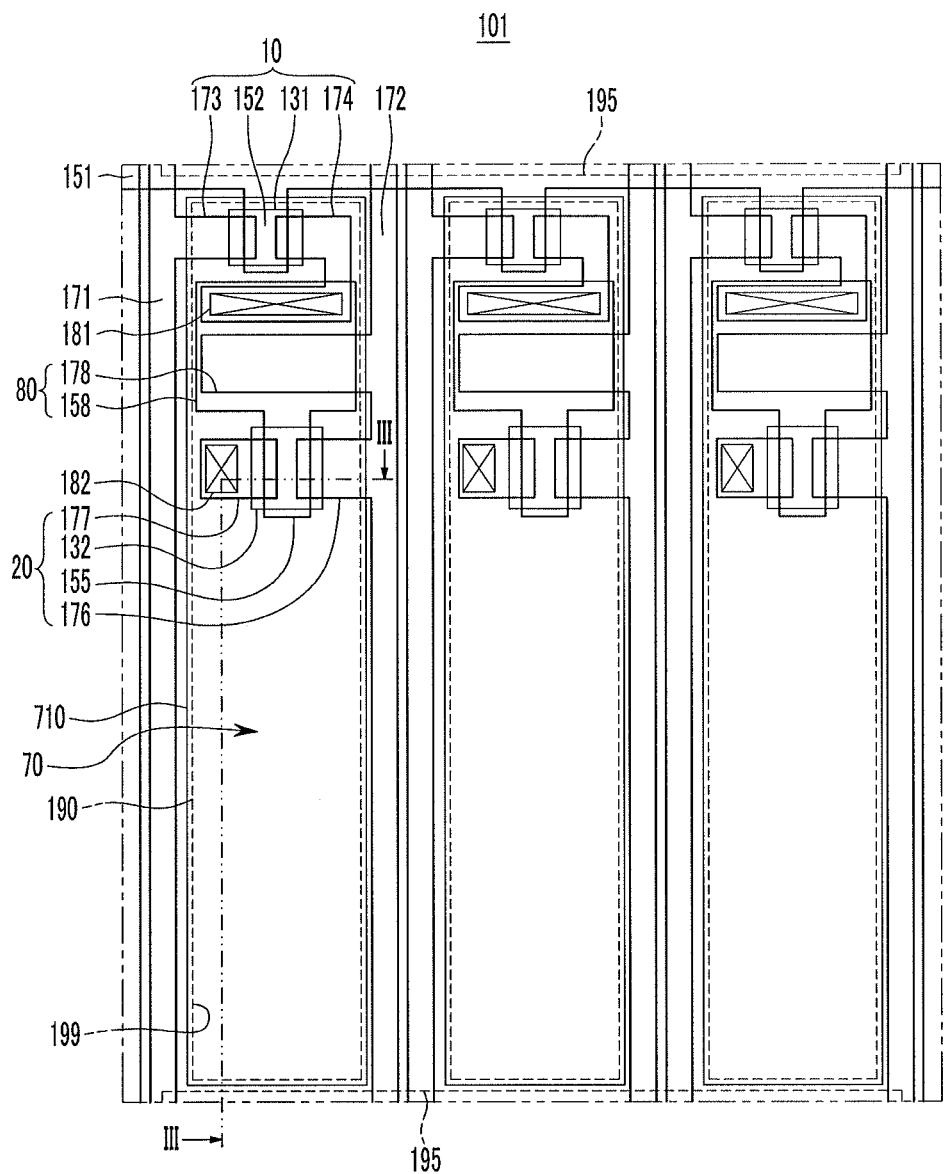
FIG. 2 is a top plan layout view of a pixel of the OLED display according to the first exemplary embodiment.
Figure 3:
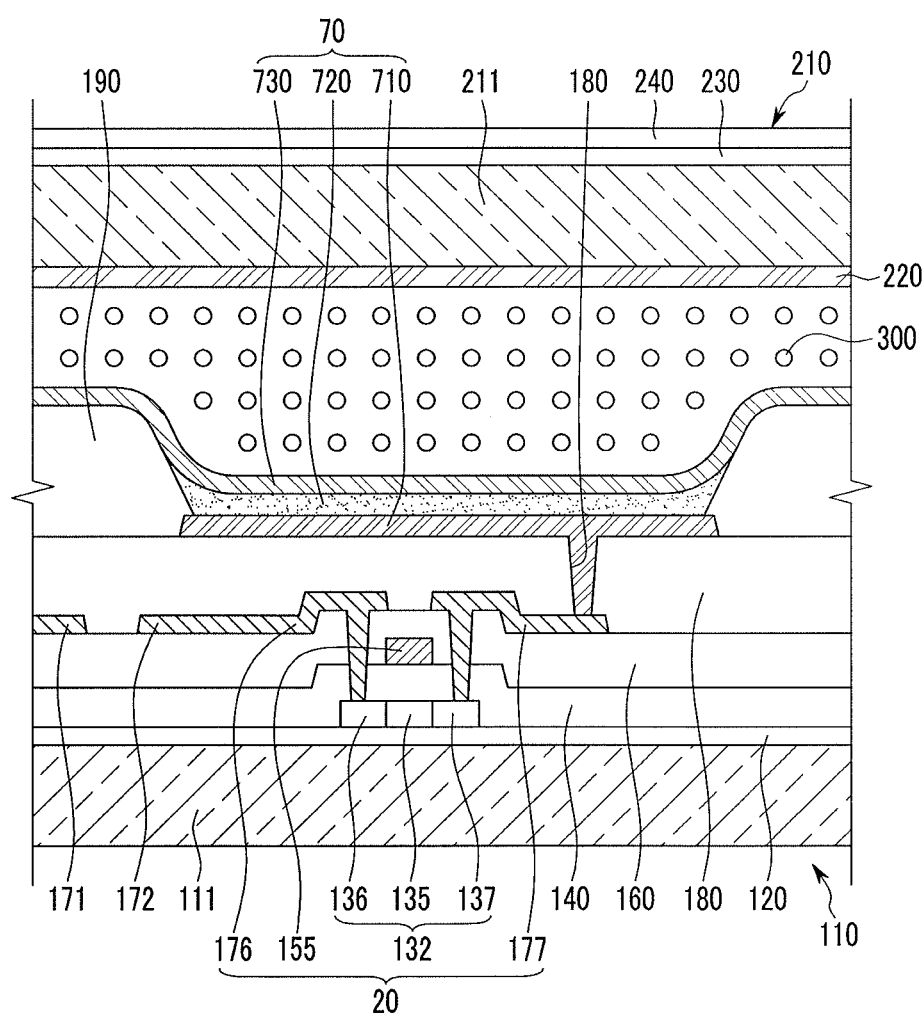
FIG. 3 is a cross-sectional view of the OLED display of FIG. 2, taken along the line III-III according to the first exemplary embodiment.
Figure 4:
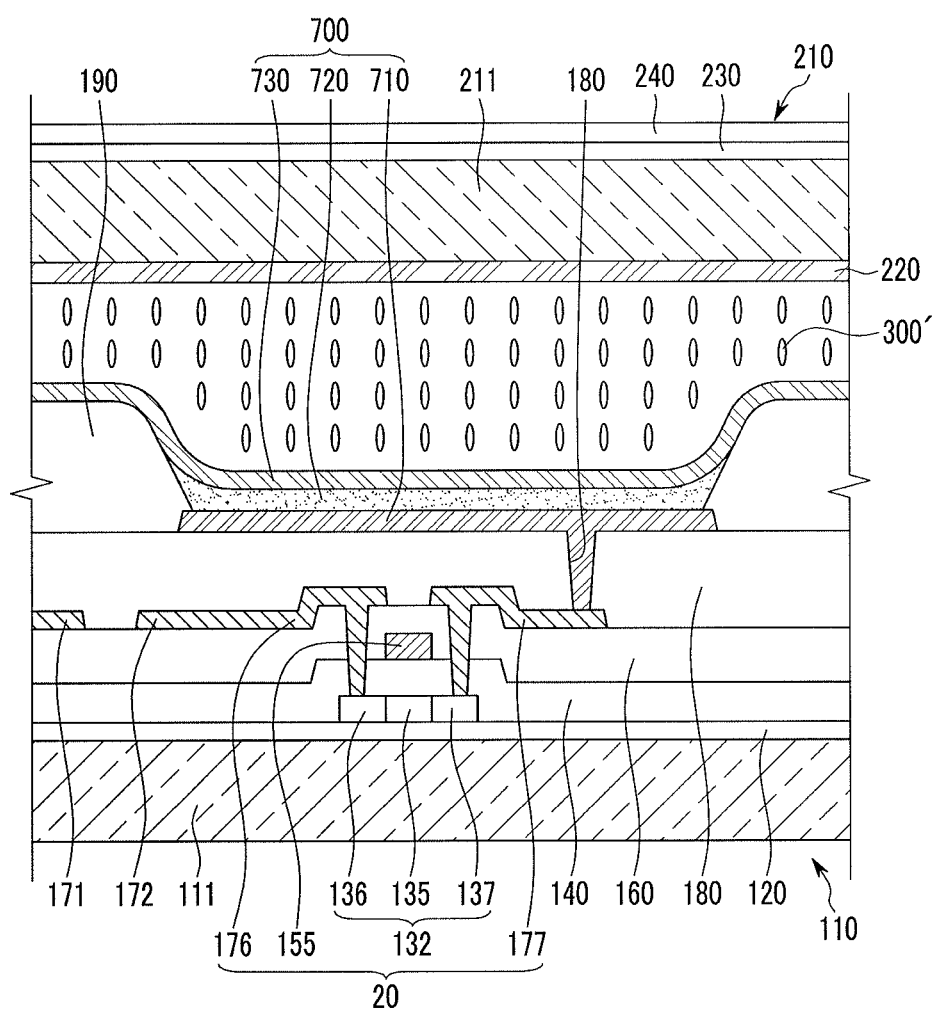
FIG. 4 is a cross-sectional view of liquid crystals of the OLED display, in the state of being driven, according to the first exemplary embodiment.

FIG. 2 is a plan layout view of a pixel of the OLED display 101 according to the first exemplary embodiment. FIGS. 3-4 are cross-sectional views of FIG. 2, taken along the line III-III, respectively illustrating before and after driving of the liquid crystal of the display device 101. The OLED display 101, according to the present exemplary embodiment, will be described in further detail with reference to FIGS. 2-4.

FIGS. 2-3 have an active matrix (AM) type OLED display 101 with a 2Tr-1Cap structure. A pixel is provided with two thin film transistors (TFT) and one capacitor, but the present embodiments are not limited thereto. The organic light emitting diode display may be provided with three or more thin film transistors and two or more storage capacitors in one pixel. The organic light emitting diode display may be configured to have various configurations with additional wires. The pixel represents a minimum display image unit. The OLED display displays the image with a plurality of pixels.

The display substrate 110 includes a switching thin film transistor 10, a driving thin film transistor 20, a capacitor 80, and an organic light emitting element 70 formed in each pixel.

The display substrate 110 further includes gate lines 151 arranged along one direction, data lines 171, and common power lines 172. The data lines 171 and the common power lines 172 cross the gate lines 151 in an insulated manner.

The organic light emitting element 70 includes a pixel electrode 710, an organic emission layer 720 formed on the pixel electrode 710, and a common electrode 730 formed on the organic emission layer 720. In the present exemplary embodiment, the pixel electrode 710 is a positive electrode, i.e., a hole injection electrode. The common electrode 730 is a negative electrode, i.e., an electron injection electrode. However, the present embodiments are not limited thereto. Holes and electrons are injected to the organic emission layer 720 from the pixel electrode 710 and the common electrode 730. Emission of light from the organic emission layer 720 occurs when the excitons drop from the excited state to the ground state. The excitons are combinations of the injected holes and electrons.

The capacitor 80 includes a first capacitor plate 158 and a second capacitor plate 178. The first capacitor 158 and the second capacitor plate 178 have interposed therebetween a gate insulating layer 140. The gate insulating layer 140 functions as a dielectric material. Charges charged in the capacitor 80 and a voltage between the two capacitor plates 158 and 178 determine capacitance.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177. The switching thin film transistor 10 is used to select a pixel for light emission. The switching gate electrode 152 is connected to the gate line 151. The switching source electrode 173 is connected to the data line 171. The switching drain electrode 174 is connected to the first capacitor plate 158, and separated from the switching source electrode 173.

The driving thin film transistor 20 applies driving power to the pixel electrode 710 for light emission of an organic emission layer 720. In the selected pixel, the organic emission layer 720 is part of an organic light emitting element 70. The driving gate electrode 155 is connected to the first capacitor plate 158. The driving source electrode 176 and the second capacitor plate 178 are connected to the common power line 172. The driving drain electrode 177 is connected to the pixel electrode 710 through a contact hole 182. The pixel electrode 710 is part of the organic light emitting element 70.

With such a configuration, the switching thin film transistor 10 is driven by a gate voltage applied to the gate line 151. The gate line 151 transfers a data voltage applied to the data line 171 to the driving thin film transistor 20. A voltage corresponding to a difference between the common voltage, applied to the driving thin film transistor 20 from the common power line 172, and the data voltage, transmitted from the switching thin film transistor 10, is stored in the capacitor 80. A current corresponding to the voltage stored in the capacitor 80 flows to the organic light emitting element 70 through the driving thin film transistor 20. Thus, the organic light emitting element 70 emits light.

A structure of the OLED display 101, according to the present exemplary embodiment, will be described in further detail according to the layering order.

A substrate member 111 of the display substrate 110 is formed with an insulating substrate, e.g. glass. A buffer layer 120 is formed on the first substrate member 111. The buffer layer 120 is formed of silicon nitride (SiNx), silicon oxide (SiOx), silicon nitroxide (SiOxNy), etc. The buffer layer 120 may be omitted, depending on the type and process condition of the substrate member 111. The driving semiconductor layer 132 is formed on the buffer layer 120. The driving semiconductor layer 132 includes a channel region 135 in which an impurity is not doped. The driving semiconductor layer 132 also includes a source region 136 and a drain region 137 that are p+ doped to both ends of the channel region 135. The doped ion material is the p-type impurity, e.g., Boron B.

In the first exemplary embodiment, the thin film transistor 20 with a PMOS structure, uses the p type impurity, as the driving thin film transistor 20. However, embodiments are not limited thereto. Therefore, NMOS structure or CMOS structure thin film transistor may be used as the driving thin film transistor 20

In the present exemplary embodiment, the driving thin film transistor 20 is a polysilicon thin film transistor. The polysilicon thin film transistor may include a polycrystalline silicon film. The switching thin film transistor 10, not shown in FIG. 3, may be a polysilicon thin film transistor or an amorphous thin film transistor. The amorphous thin film transistor may include an amorphous silicon film.

A gate insulating layer 140, formed of silicon nitride or silicon oxide is formed on the driving semiconductor layer 132. Gate wires, including the driving gate electrode 155, are formed on the gate insulating layer 140. The gate wires also further include the gate line 151, the first capacitor plate 158, and other wires. The driving gate electrode 155 at least partially overlaps the driving semiconductor layer 132, i.e., the channel region 135. An interlayer insulating layer 160, covering the gate insulating layer 140, is formed on the driving gate electrode 155. Holes exposing the source region 136 and the drain region 137 of the driving semiconductor layer 132 are formed in the gate insulating layer 140 and the interlayer insulating layer 160. The interlayer insulating layer, similar to the gate insulating layer 140, is formed of silicon nitride, silicon oxide, etc. Data wires, including the driving source electrode 176 and the driving drain electrode 177, are formed on the interlayer insulating layer 160. The data wires also include the data line 171, the common power line 172, the second capacitor plate 178, and other wires. The driving source electrode 176 and the driving drain electrode 177 are connected to the source region 136 and the drain region 137, respectively. The driving source electrode 176 and the driving drain electrode 177 are connected to the source region 136 and the drain region 137 of the driving semiconductor layer 132 through the holes formed in the interlayer insulating layer 160 and the gate insulating layer 140.

The driving thin film transistor 20 is formed. The driving thin film transistor includes the driving semiconductor layer 132, driving gate electrode 155, driving source electrode 176, and driving drain electrode 177. However, the configuration of the driving thin film transistor 20 is not limited to the above examples. Therefore, the configuration may be modified with known configurations easily performed by those skilled in the art.

A contact hole 182 partially exposing the drain electrode 177 is formed in the planarization layer 180. The interlayer insulating layer 160 or the planarization layer 180 may be omitted.

The pixel electrode 710, of the organic light emitting element 70, is formed on the planarization layer 180. The pixel electrode 710 is connected with the drain electrode 177 through the contact hole 182. A pixel defining layer 190, having a plurality of openings 199, exposes the respective pixel electrodes 710 formed on the planarization layer 180. A portion where the pixel defining layer 190 is formed becomes a non-light emission region. A portion where the openings 199 of the pixel defining layer 190 are formed becomes a light emission region. The organic emission layer 720 is formed on the pixel electrode 710. The common electrode 730 is formed on the organic emission layer 720 so that the organic light emitting element 70 is formed. The organic emission layer 720 is formed with a low molecular organic material or a high molecular organic material. The organic emission layer 720 may have a multiple layered structure with more than one of an emissive layer, a hole injection layer (HIL), a hole transporting layer (HTL), an electron transporting layer (ETL), and an electron injection layer (EIL).

The OLED display 101, according to the present exemplary embodiment, is a front emission type. Therefore, light is emitted toward the encapsulation substrate 210. In the present exemplary embodiment, the common electrode 730 is formed with a transparent conductive material and the pixel electrode 710 is formed with a reflective conductive material. The transparent conductive material forming the common electrode 730 may include indium zinc oxide (ITO) or indium zinc oxide (IZO). The reflective conductive material forming the pixel electrode 710 may include aluminum (Al), silver (Ag), magnesium (Mg), or an alloy thereof. In addition, a reflective layer (not shown) may be formed on the pixel electrode 710 to effectively reflect light to a direction of the encapsulation substrate 210. The light is moving toward the pixel electrode 710.

The encapsulation substrate 210 is disposed on the common electrode 730 facing the display substrate 110. The encapsulation substrate 210 is sealed with the display substrate 110 by the sealing member 400. The sealing member 400 seals the organic light emitting element 70 for protection. The encapsulation substrate 210 includes a second substrate member 211, which may be formed with transparent glass. Transparent glass may be used for front light emission.

A phase compensation plate 230 and a polarizing plate 240 may be formed on the encapsulation substrate 210. The polarizing plate 240 has a polarization shaft and linearly polarizes light to a direction of the polarization shaft. The polarizing plate 240 passes light matching the polarization shaft. The polarizing plate 240 absorbs light that does not match the polarization shaft. The phase compensation plate 230 is formed with a ¼ wavelength plate to compensate a generated phase difference. The phase difference occurs according to a light incident direction on the OLED display 101. The phase compensation plate 230 and the polarizing plate 240 suppress reflection of external light and improves visibility. A plurality of phase compensation plates and polarization plates may be stacked, using various methods, according to the manufacturing process and requirements.

Referring to FIG. 3, between the display substrate 110 and the encapsulation substrate 210, the liquid crystals 300 are filled. The liquid crystals 300 are driven by a vertical electric field. The liquid crystal driving electrode 220 is formed at a lower portion of the encapsulation substrate to face the organic light emitting element 70. The liquid crystal driving electrode 220 drives the liquid crystals 300. According to this configuration, the liquid crystal driving electrode 220, together with the common electrode 730 of the organic light emitting element 70, can drive the liquid crystals 300. As shown in FIG. 3, in the present exemplary embodiment, the liquid crystal driving electrode 220 wholly covers the bottom side of the encapsulation substrate 210. The liquid crystals 300 can be stably driven by integrally forming the liquid crystal driving electrode 220.

When not applied with the electric field, the liquid crystals 300 have an optical isotropic property. When applied with the electric field, the liquid crystals 300 have optical anisotropic property. Even though the electric field is not applied, a nematic liquid crystal has reflective index anisotropy. Thus, a nematic liquid crystal may deteriorate a wide viewing angle. When the nematic liquid crystal is used for assuring a narrow viewing angle, an image can be displayed, without deteriorating image quality, only at a specific position of the screen. Due to the reflective anisotropy, this limitation occurs even though a voltage is not applied to the liquid crystal driving electrode. For a nematic liquid crystal, deterioration of the viewing angle is unavoidable in other directions. Blue-phase liquid crystal has a liquid crystal phase, in a temperature range between a chiral nematic phase and an isotropic phase. Blue-phase liquid crystal maintains optical isotropy when an electric field is not applied. Blue-phase liquid crystal maintains optical anisotropy when the electric field is applied. Thus, the blue-phase liquid crystal maintains optical isotropy, but becomes anisotropy with high speed when the electric field is applied. The blue-phase liquid crystal can control transmittance of light in a specific direction. In the present exemplary embodiment, the liquid crystals 300 are formed with blue-phase liquid crystal in order to easily control a wide viewing angle mode and a narrow viewing angle mode of the OLED display 101.

Blue-phase liquid crystal has a fast response speed. When the blue-liquid crystal is used, an additional alignment process is not required. Thus, the manufacturing process can be simplified.

Referring to FIGS. 3-4, in the present exemplary embodiment, the blue-phase liquid crystal is used as the liquid crystals 300. Thus, the liquid crystals 300 maintain optical isotropy when the electric field is not applied to the liquid crystals 300. The liquid crystals 300' maintain optical anisotropy when a voltage is applied to the liquid crystal driving electrode 220. When a voltage is applied to the liquid crystal driving electrode 220, an electric field is applied. In the present exemplary embodiment, the electric field is perpendicularly applied. Therefore, the liquid crystals 300' have optical anisotropy in a perpendicular direction.

Figure 5:
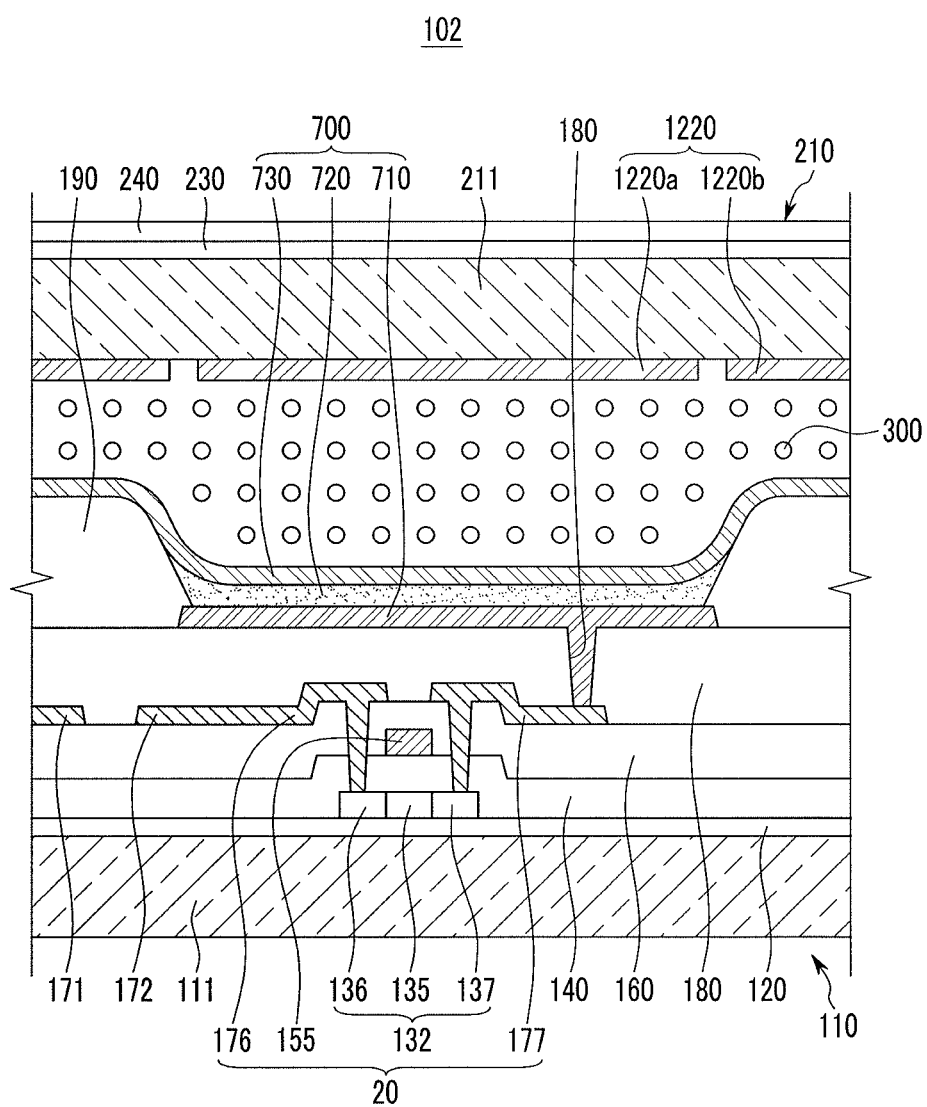
FIG. 5 is a cross-sectional view of an OLED display according to a second exemplary embodiment.

As shown in FIG. 5, while the OLED display 101 is being driven and the same voltage is applied to the liquid crystal driving electrode 220 and the common electrode 730, the wide viewing angle mode is realized. A wide viewing angle mode is realized due to the optical isotropy characteristics of the liquid crystals 300. As shown in FIG. 4, while the OLED display 101 is being driven and the liquid crystal driving electrode 220 and the common electrode 730 are applied with different voltages, the narrow viewing angle mode is realized. The narrow viewing angle mode is realized due to the optical anisotropy characteristic of the liquid crystals 300'. When the OLED display is viewed from the front, external light passing through the OLED display 101 does not have a phase difference due to deformation of the blue-phase liquid crystals 300'. Thus, there is no change in the viewing angle. While passing through the blue-phase liquid crystals 300' having optical anisotropy between the two substrates 110 and 210 so that the OLED display 101 is driven in the narrow viewing angle mode, external light incident from the up, down, left, and right sides deteriorates a contrast ratio CR.

In the OLED display 101, according to the present exemplary embodiment, the blue-phase liquid crystals are filled between the display substrate 110 and the encapsulation substrate 210. Thus, the wide viewing angle mode and the narrow viewing angle mode can be easily controlled. The modes can be controlled by a voltage applied to the liquid crystal driving electrode 220. Since the blue-phase liquid crystal has a fast response speed, the mode can be changed quickly. An additional alignment process is not required when using the blue-phase liquid crystal. Thus, the manufacturing process can be simplified.

Figure 6:
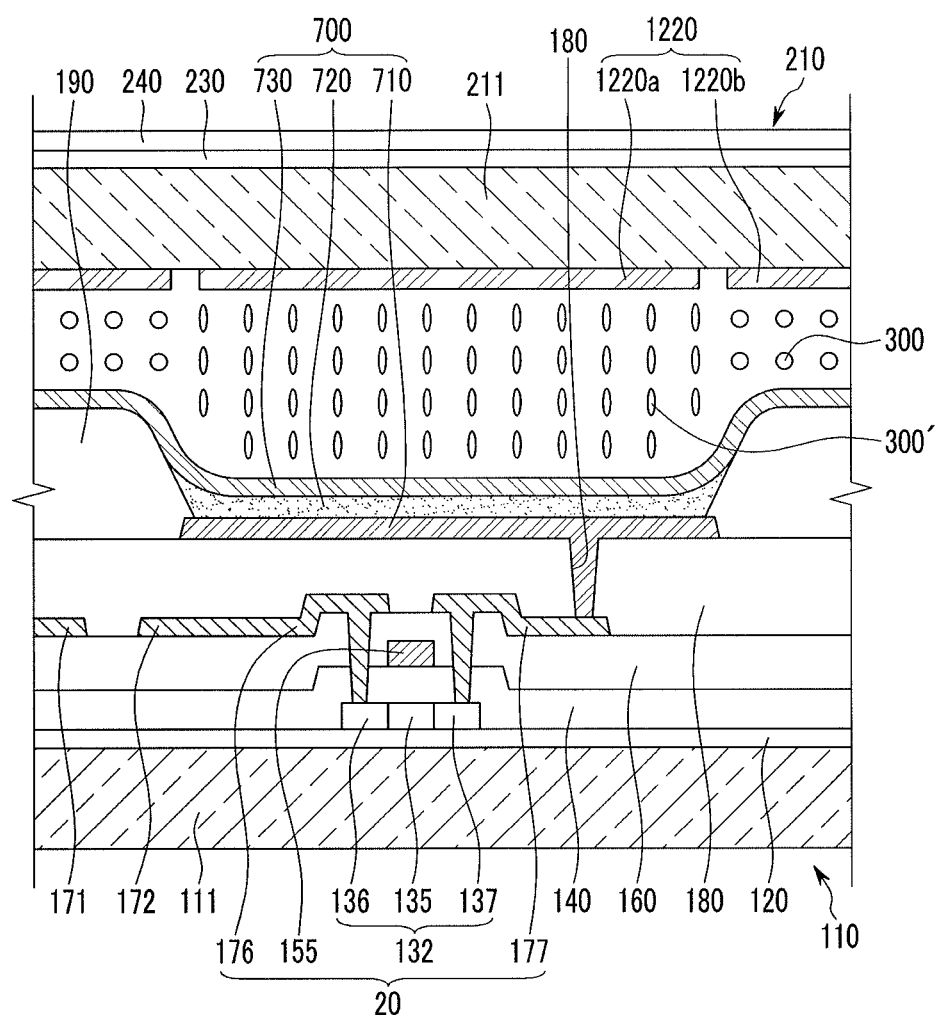
FIG. 6 is a cross-sectional view of liquid crystals of the OLED display, in the state of being driven, according to the second exemplary embodiment.

FIGS. 5-6 are cross-sectional views of an OLED display 102 according to a second exemplary embodiment. FIGS. 5-6 show before and after liquid crystals driving the OLED display 102. The OLED display 102, according to the second exemplary embodiment, will be described with reference to FIGS. 5-6. In the present exemplary embodiment, parts described in the first exemplary embodiment will be omitted.

Referring to FIG. 5, the OLED display 102, according to the present exemplary embodiment, has a configuration similar to that of the OLED display 101 of the first exemplary embodiment. A display substrate 110 and an encapsulation substrate 210 are disposed to face each other. An organic light emitting element 70 and electron elements, e.g., a driving thin film transistor 20 for driving the organic light emitting element 70, are formed on the display substrate 110. A phase compensation plate 230 and a polarization plate 240 may be formed on the encapsulation substrate 210 to suppress reflection of external light and improve visibility. Liquid crystals 300, having optical isotropy, are filled between the display substrate 110 and the encapsulation substrate 210. Liquid crystals 300, according to the present exemplary embodiment, are formed with a blue-phase liquid crystal.

A liquid crystal driving electrode 1220 is formed at a lower portion of the encapsulation substrate 120 in order to drive the liquid crystals 300. The liquid crystal driving electrode 1220, according to the present exemplary embodiment, includes a first liquid crystal driving electrode 1220a and a second liquid crystal driving electrode 1220b. As shown in FIG. 5, the first liquid crystal driving electrode 1220a is formed to correspond to an organic emission layer 720 of the organic light emitting element 70. The second liquid crystal driving electrode 1220b may be formed in areas other than where the first liquid crystal driving electrode 1220a is formed. The second liquid crystal driving electrode 1220b is separated from the first liquid crystal driving electrode 1220a. The first liquid crystal driving electrode 1220a is formed in a light emission area. The second liquid crystal driving electrode 1220b is formed in a non-light emission area.

The first liquid crystal driving electrode 1220a and the second liquid crystal driving electrode 1220b can be applied with different voltages. Thus, a voltage, different from a voltage applied to a common electrode 730, is applied to the first liquid crystal driving electrode 1220a in the light emission area. A voltage, that is the same as the voltage applied to the common electrode 730, is applied to the second liquid crystal driving electrode 1220b in the non-light emission area. Thus, the liquid crystals 300 can be selectively driven. Referring to FIG. 4, the liquid crystals 300', corresponding to the light emission area, is deformed to have optical anisotropy in a perpendicular direction. The liquid crystals 300, corresponding to the non-light emission area, has optical isotropy and is not deformed.

According to the present exemplary embodiment, the liquid crystals 300, corresponding to the light emission area, is selectively driven to suppress a driving abnormality in the liquid crystals 300. When the substrates 110 and 210 of the OLED display 102 are increased in size, an electric field cannot be weakened. Preventing the electric field from weakness occurs by increasing resistance of the liquid crystal driving electrode 220.

In a general OLED, in order to improve visibility of external light, an external light reflection prevention film may be applied to the OLED display. In this scenario, the entire visibility of the OLED display is improved so that a wide outdoor viewing angle can be assured. However, when the display device is always driven in a wide viewing angle mode, personal data may be exposed to peripheral users. Thus, to prevent exposure of personal data, a viewing angle must be limited.

For data protection, when the conventional OLED display device is always driven in a narrow viewing angle, there is a limitation for multiple users.

According to the present embodiments, an OLED display is provided having the advantage of controlling viewing angles. A viewing angle of light emitted from the OLED display can be selectively controlled.

In addition, according to the present embodiments, the OLED display can be formed in a simple structure. The response speed can also be improved by using liquid crystals having optical isotropy. An alignment process can be omitted so that the manufacturing process of the OLED display can be simplified.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. An organic light emitting diode (OLED) display, comprising:
   a first substrate;
   a second substrate facing the first substrate;
   an organic light emitting element on the first substrate, the organic light emitting element including a pixel electrode, an organic emission layer, and a common electrode;
   a liquid crystal driving electrode facing the organic light emitting element at a lower portion of the second substrate, the liquid crystal driving electrode including a portion directly above the organic emission layer of the organic light emitting element; and
   a plurality of liquid crystals between the organic light emitting element and the liquid crystal driving electrode, wherein the plurality of liquid crystals is driven by the common electrode and the liquid crystal driving electrode such that the plurality of liquid crystals has optical isotropy when an electric field is not applied between the common electrode and the liquid crystal driving electrode and has optical anisotropy when the electric field is applied between the common electrode and the liquid crystal driving electrode.

2. The OLED display of claim 1, wherein the liquid crystals are blue-phase liquid crystals.

3. The OLED display of claim 1, wherein:
the pixel electrode, the organic emission layer, and the common electrode are sequentially stacked in the organic light emitting element.

4. The OLED display of claim 1, further comprising:
a phase compensation plate formed at an opposite side of the liquid crystal driving electrode on the second substrate; and
a polarizing plate on the phase compensation plate.

5. The OLED display of claim 4, wherein the liquid crystal driving electrode is indium tin oxide (ITO) or indium zinc oxide (IZO).

6. The OLED display of claim 1, wherein the liquid crystal driving electrode is transparent.

7. The OLED display of claim 1, wherein the common electrode is transparent.

8. The OLED display of claim 7, wherein the liquid crystal driving electrode is ITO or IZO.

9. The OLED display of claim 1, further comprising:
a reflective layer on the pixel electrode.

10. An organic light emitting diode (OLED) display, comprising:
a first substrate;
a second substrate facing the first substrate;
an organic light emitting element on the first substrate, the organic light emitting element including a pixel electrode, an organic emission layer, and a common electrode;
a sealing member sealing the first substrate and the second substrate;
a liquid crystal driving electrode facing the organic light emitting element at a lower portion of the second substrate, the liquid crystal driving electrode wholly covering an entire area of the second substrate bounded by the sealing member; and
a plurality of liquid crystals between the organic light emitting element and the liquid crystal driving electrode,
wherein the plurality of liquid crystals is driven by the common electrode and the liquid crystal driving electrode such that the plurality of liquid crystals has optical isotropy when an electric field is not applied between the common electrode and the liquid crystal driving electrode and has optical anisotropy when the electric field is applied between the common electrode and the liquid crystal driving electrode.

11. An organic light emitting diode (OLED) display, comprising:
a first substrate;
a second substrate facing the first substrate;
an organic light emitting element on the first substrate;
a liquid crystal driving electrode facing the organic light emitting element at a lower portion of the second substrate, the liquid crystal driving electrode including a first liquid crystal driving electrode, the first liquid crystal driving electrode being directly above the organic light emitting element, and a second liquid crystal driving electrode separated from the first liquid crystal driving electrode so as to not be directly above the organic light emitting element; and
a plurality of liquid crystals between the organic light emitting element and the liquid crystal driving electrode,
wherein the plurality of liquid crystals has optical isotropy when an electric field is not applied and has optical anisotropy when the electric field is applied.

* * * * *